United States Patent
Fukuta et al.

(10) Patent No.: US 9,112,344 B2
(45) Date of Patent: Aug. 18, 2015

(54) DRIVER FOR SWITCHING ELEMENT AND CONTROL SYSTEM FOR ROTARY MACHINE USING THE SAME

(71) Applicant: DENSO CORPORATION, Kariya, Aichi-pref. (JP)

(72) Inventors: Junichi Fukuta, Kuwana (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 168 days.

(21) Appl. No.: 13/837,503

(22) Filed: Mar. 15, 2013

(65) Prior Publication Data
US 2013/0242438 A1    Sep. 19, 2013

(30) Foreign Application Priority Data
Mar. 16, 2012    (JP) .................................. 2012-059653

(51) Int. Cl.
*H02H 7/16*    (2006.01)
*H02H 1/00*    (2006.01)
*H03K 17/082*    (2006.01)
*H02P 29/02*    (2006.01)

(52) U.S. Cl.
CPC .............. *H02H 1/0007* (2013.01); *H02H 7/16* (2013.01); *H02P 29/027* (2013.01); *H02P 29/028* (2013.01); *H03K 17/0828* (2013.01); *H03K 2217/0027* (2013.01)

(58) Field of Classification Search
CPC ....... H02H 1/0007; H02H 3/087; H02H 7/16; H03K 17/0828; H02P 29/027; H02P 29/028
See application file for complete search history.

(56) References Cited

U.S. PATENT DOCUMENTS

| | | | | |
|---|---|---|---|---|
| 4,949,213 | A | * | 8/1990 | Sasagawa et al. ............. 361/91.4 |
| 5,500,616 | A | * | 3/1996 | Ochi .............................. 327/310 |
| 6,335,608 | B1 | * | 1/2002 | Takahashi ...................... 318/811 |
| 8,705,214 | B2 | * | 4/2014 | Hallak et al. .................... 361/16 |

FOREIGN PATENT DOCUMENTS

| | | |
|---|---|---|
| JP | 05-227738 | 9/1993 |
| JP | 09-182275 | 7/1997 |
| JP | 2913699 | 4/1999 |
| JP | 3548497 | 4/2004 |
| JP | 2004-222367 | 8/2004 |

* cited by examiner

*Primary Examiner* — Zeev V Kitov
(74) *Attorney, Agent, or Firm* — Nixon & Vanderhye PC

(57) ABSTRACT

In a driver, a dissipating unit dissipates, upon a potential difference between input and output terminals of a switching element being lower than a predetermined potential, electrical charge for overcurrent detection between the input and output terminals. The dissipating unit includes a rectifier having a pair of first and second conductive terminals. The first conductive terminal is connected to the input terminal of the switching element. An overcurrent determiner determines that an overcurrent flows between the input and output terminals of the switching element upon determination that electrical charge has not been dissipated by the dissipating unit despite the change of the switching element from the off state to the on state. A failure determiner determines whether there is a failure in the dissipating unit as a function of a potential at a point on the first electrical path from the failure determiner to the second conductive terminal.

9 Claims, 8 Drawing Sheets

__US 9,112,344 B2__

DRIVER FOR SWITCHING ELEMENT AND CONTROL SYSTEM FOR ROTARY MACHINE USING THE SAME

CROSS REFERENCE TO RELATED APPLICATIONS

This application is based on and claims the benefit of priority from Japanese Patent Application 2012-059653 filed on Mar. 16, 2012, the disclosure of which is incorporated in its entirety herein by reference.

TECHNICAL FIELD

The present disclosure relates to drivers for a switching element, more particularly, to such drivers for measuring an overcurrent flowing between input and output terminals of a switching element as a function of the difference in potential therebetween.

BACKGROUND

A typical example of these drivers is disclosed in Japanese Patent Publication No. 3548497. The driver for an IGBT (Insulated-Gate Bipolar Transistor) as an example of semi-conductor switching elements includes a diode and a resistive element comprised of a pair of series-connected resistors, and the diode and the resistive element are connected between the collector and emitter of the IGBT. Specifically, the anode of the diode is connected to one end of the resistive member, and the cathode is connected to the collector of the IGBT. The connection point between the one end of the resistive element and the anode of the diode is connected to the gate of the IGBT via a resistor. To the gate of the IGBT, a power supply source is connected for charging the gate.

The driver configured set forth above is adapted to measure an overcurrent flowing through the IGBT as a function of the variations in the potential at the connection point between the series-connected resistors of the resistive element. Next, how the driver measures an overcurrent will be described hereinafter.

When the IGBT is turned on, the power supply source charges the gate of the IGBT, resulting in an increase in the voltage at the gate. Thereafter, the IGBT is turned from ON to OFF.

If no overcurrent flows between the collector and emitter of the IGBT, the collector-emitter voltage becomes lower than the potential at the anode of the diode, so that the electrical charge stored on the gate of the IGBT are transferred from the gate to the collector via the diode. This discharge of the gate results in potential drop at the connection point between the diode and the resistive member. The potential drop causes the potential at the connection point between the series-connected resistors of the resistive member to drop down to a level close to the potential at the emitter of the IGBT.

In contrast, if an overcurrent flows between the collector and emitter of the IGBT, the collector-emitter voltage is kept at a high level despite the turn-on of the IGBT, so that the electrical charge stored on the gate of the IGBT remain thereon without being discharged from the gate to the collector via the diode. For this reason, the voltage at the gate of the IGBT is divided between the resistances of the series-connected resistors of the resistive member and the resistance of the resistor connected to the gate of the IGBT; the voltage division defines the potential at the connection point between the series-connected resistors. The potential at the connection point between the series-connected resistors becomes higher than the level close to the potential at the emitter of the IGBT.

Thus, the driver is adapted to determine whether an overcurrent flows through the collector-emitter of the IGBT as a function of the variations in the potential at the connection point between the series-connected resistors of the resistive member.

SUMMARY

A failure in the function of measuring an overcurrent, such as a malfunction of the diode, in the aforementioned driver may result in a difficulty measuring an overcurrent flowing between the collector and emitter of the IGBT. This may make it difficult for the driver to fail-safe the malfunction properly, resulting in drop of the reliability of the IGBT.

In view of the circumstances set forth above, one aspect of the present disclosure seeks to provide drivers for a switching element, which are designed to solve the problem set forth above.

Specifically, an alternative aspect of the present disclosure aims to provide such drivers, which are capable of determining whether there is a failure in a function of measuring an overcurrent flowing between input and output terminals of the switching element.

According to a first exemplary aspect of the present disclosure, there is provided a driver for driving a switching element having an input terminal and an output terminal. The driver includes a dissipating unit configured to dissipate, upon a potential difference between the input and output terminals being lower than a predetermined potential, electrical charge stored in the dissipating unit based on change of the switching element from an off state to an on state. The electrical change is for overcurrent detection between the input and output terminals. The dissipating unit includes a rectifier having a pair of first and second conductive terminals. The first conductive terminal is connected to the input terminal of the switching element. The rectifier is configured to prevent a current from flowing from the first conductive terminal to the second conductive terminal. The driver includes an overcurrent determiner configured to determine whether the electrical charge has been dissipated by the dissipating unit, and determine that an overcurrent flows between the input and output terminals of the switching element upon determination that the electrical charge has not been dissipated by the dissipating unit despite the change of the switching element from the off state to the on state. The driver includes a failure determiner connected to the second conductive terminal of the rectifier via a first electrical path and configured to determine whether there is a failure in the dissipating unit as a function of a potential at a point on the first electrical path from the failure determiner to the second conductive terminal.

According to a second exemplary aspect of the present disclosure, there is provided a control system for controlling a rotary machine. The control system includes a converter equipped with at least one pair of first switching elements connected in series. Each of the first switching elements has an input terminal and an output terminal. The driver includes an inverter equipped with at least one pair of second switching elements connected in series. Each of the second switching elements has an input terminal and an output terminal. The control system includes a driver for driving each of the first and second switching elements to thereby boost a DC voltage inputted to the converter, and invert the boosted DC voltage into an AC voltage to be supplied to the rotary machine. The driver for each of the first and second switching elements includes a dissipating unit configured to dissipate, upon a potential difference between the input and output terminals of a corresponding one of the first and second switching elements being lower than a predetermined potential, electrical charge stored in the dissipating unit based on change of a corresponding one of the first and second switching elements from an off state to an on state. The electrical charge is for overcurrent detection between the input and output terminals of a corresponding one of the first and second switching elements. The dissipating unit includes a rectifier having a pair of first and second conductive terminals. The first conductive terminal is connected to the input terminal of a corresponding one of the first and second switching elements. The rectifier is configured to prevent a current from flowing from the first conductive terminal to the second conductive terminal. The driver for each of the first and second switching elements includes an overcurrent determiner configured to determine whether the electrical charge has been dissipated by the dissipating unit, and determine that an overcurrent flows between the input and output terminals of a corresponding one of the first and second switching elements upon determination that the electrical charge has not been dissipated by the dissipating unit despite the change of a corresponding one of the first and second switching elements from the off state to the on state. The driver for each of the first and second switching elements includes a failure determiner connected to the second conductive terminal of the rectifier via a first electrical path and configured to determine whether there is a failure in the dissipating unit as a function of a potential at a point on the first electrical path from the failure determiner to the second conductive terminal.

In each of the first and second exemplary aspects of the present disclosure, if there is a fault in the dissipating unit, the potential at a point on the first electrical path connecting from the failure determiner to the second conducive terminal of the rectifier is changed from a potential at a point on the first electrical path obtained if there are no failures in the dissipating unit. In view of this point, the potential at a point on the first electrical path from the failure determiner to the second conductive terminal serves as a parameter for determining whether there is a failure in the dissipating unit. In each of the first and second exemplary aspects of the present disclosure, the failure determiner is configured to determine whether there is a failure in the dissipating unit as a function of a potential at a point on the first electrical path from the failure determiner to the second conductive terminal. Thus, it is possible to improve the reliability of the switching element due the occurrence of an overcurrent.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

An embodiment of the present disclosure will be described hereinafter with reference to the accompanying drawings.

First Embodiment

Figure 1:
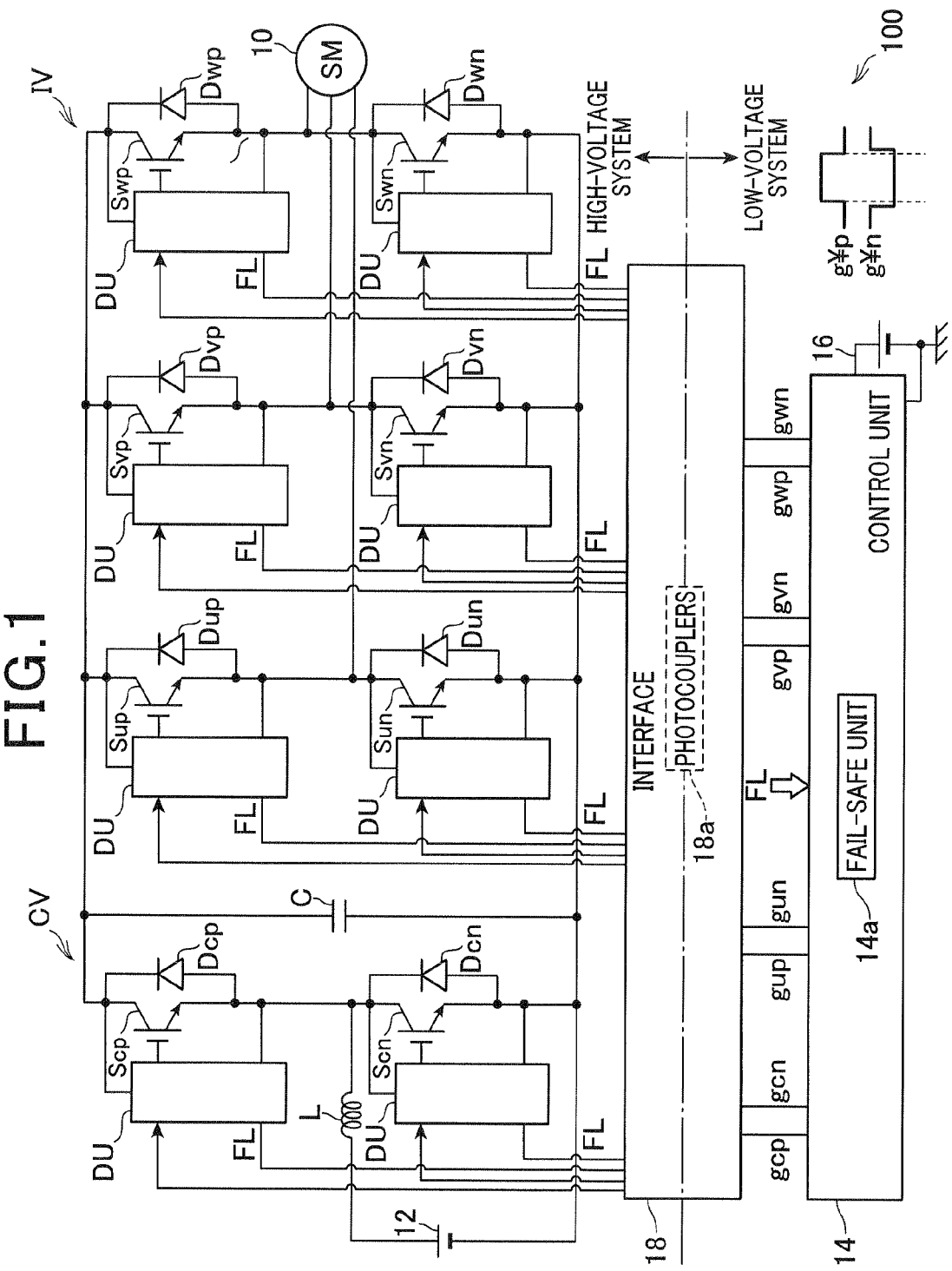
FIG. 1 is a view schematically illustrating an overall configuration of a control system for a motor-generator according to an embodiment of the present disclosure.

Referring to FIG. 1, there is illustrated a three-phase motor-generator as an example of rotating machines, referred to simply as a "motor-generator" 10, installed in, for example, a motor vehicle as a main engine according to this embodiment. The motor-generator 10 is mechanically coupled to driving wheels (not shown) of the motor vehicle.

For example, as the motor-generator 10, a brushless DC motor, i.e. a three-phase SM (Synchronous Motor), is used.

The motor-generator 10 is made up of, for example, a rotor including a magnetic field and a stator including three-phase windings, i.e. U-, V-, and W-phase windings. The rotor of the motor-generator 10 is rotated based on magnetic interaction between the magnetic field of the rotor and a rotating field generated by the three-phase windings when the three-phase windings are energized. For example, the three-phase windings (U-, V-, and W-phase windings) each have one end connected to a common junction (neutral point) and the other end to a separate terminal in, for example, a star-configuration.

In FIG. 1, there is also illustrated a control system 100 for controlling the motor-generator 10. The control system 100 is equipped with an inverter INV, a converter CNV, a high-voltage battery 12 as an example of DC power sources, drive units, i.e. drivers, DU, a control unit 14, a low-voltage battery 16, and an interface 18.

To the motor-generator 10, the high-voltage battery 12 is electrically connected via the inverter INV and the converter CNV. The high-voltage battery 12 has a terminal voltage of, for example, 288 V thereacross.

The converter CNV includes a capacitor C, a pair of series-connected switching elements Scp and Scn, a pair of flywheel diodes Dcp and Dcn, and a reactor L. The capacitor C is connected in parallel to the inverter INV, and the series-connected switching elements Scp and Scn are connected in parallel to the capacitor C. The flywheel diodes Dcp and Dcn are connected in antiparallel to the corresponding switching elements Scp and Scn, respectively. One end of the reactor L is connected to both the positive terminal of the high-voltage battery 12 and the connection point between the switching elements Scp and Scn. One end of the series-connected switching elements Scp and Scn of the converter CNV is connected to the positive DC input line of the inverter INV, and the other end thereof is connected to the negative DC input line of the inverter INV. The negative DC input line of the inverter INV is connected to the negative terminal of the battery 12.

The converter CNV is operative to convert the terminal voltage of the high-voltage battery 12 into a voltage higher than the terminal voltage of the high-voltage battery 12, and output the boosted voltage as an output DC voltage thereof across the capacitor C. The predetermined upper limit of the step-up of the terminal voltage by the converter CNV is set to a predetermined high voltage, such as 666 V.

The inverter INV is designed as a three-phase inverter. The inverter INV is provided with three pairs of series-connected high- and low-side (upper- and lower-arm) switching elements Sup and Sun, Svp and Svn, and Swp and Swn. The inverter INV is also provided with flywheel diodes D¥# (¥=u, v, w, #=p, n) electrically connected in antiparallel to the corresponding switching elements S¥# (¥=u, v, w, #=p, n), respectively.

In this embodiment, as the switching elements S¥# (¥=u, v, w, #=p, n), IGBTs are respectively used.

When power MOSFETs are used as the switching elements S¥# (¥=u, v, w, #=p, n), intrinsic diodes of the power MOSFETs can be used as the flywheel diodes, thus eliminating the flywheel diodes.

The three pairs of switching elements are parallelly connected to each other in bridge configuration. A connecting point through which each of the switching elements S¥p (¥=u, v, w) is connected to a corresponding one of the elements S¥n (¥=u, v, w) in series is connected to an output lead extending from the separate terminal of a corresponding one of the U-phase winding, V-phase winding, and W-phase winding. One end of the series-connected switching elements of each of the three pairs, such as the collector of the corresponding high-side switching element, is connected to the positive terminal of the high-voltage battery 12 via the positive DC input line. The other end of the series-connected switching elements of each of the three pairs, such as the emitter of the corresponding low-side switching element, is connected to the negative terminal of the high-voltage battery 12 via the negative DC input line.

For example, the control unit 14 operates on a power-supply voltage, lower than the terminal voltage across the high-voltage battery 12, supplied from the low-voltage battery 16. Thus, the control unit 14 and the low-voltage battery 16 constitute a low voltage system. In contrast, the motor-generator 10, the converter CNV, the inverter INV, and the high-voltage battery 12 constitute a high voltage system.

The interface 18 is provided with insulation members, such as photocouplers 18a provided for the respective switching elements S*# of the inverter INV and converter CNV. Each of the photocouplers 18a is comprised of a photodiode and a phototransistor. The photocouplers 18a are configured to enable communications between the high and low voltage systems while establishing electrical insulation therebetween. Specifically, each of the photocouplers 18a is configured to enable the control unit 14 to control a corresponding one of the switching elements S*# while establishing electrical insulation between the control unit 14 and a corresponding one of the switching elements S*#.

The control unit 14 is designed to individually drive the inverter INV and the converter CNV to thereby control a controlled variable of the motor-generator 10, such as an output torque of the motor-generator 10.

Specifically, the control unit 14 is designed to individually send drive signals gcp and gcn to the drive units DU provided for the respective switching elements Scp and Scn, thus individually turning on or off the respective switching elements Scp and Scn. The control unit 14 is also designed to individually send drive signals gup, gun, gvp, gvn, gwp, and gwn to the drive units DU provided for the respective switching elements Sup, Sun, Svp, Svn, Swp, and Swn, thus individually turning on or off the respective switching elements Sup, Sun, Svp, Svn, Swp, and Swn. The individual turn-on or off of the respective switching elements Sup, Sun, Svp, Svn, Swp, and Swn convert the output DC voltage across the capacitor C into an AC voltage, and supply the AC voltage to the motor-generator 10.

Each of the drive signals g*# has a predetermined duty cycle, i.e. a predetermined ratio of on duration to the total duration of each switching cycle for a corresponding one of the switching elements S*# (see FIG. 1). Specifically, the control unit 14 is designed to complementarily turn on the high- and low-side switching elements S*# for each leg (phase) via the corresponding drive units DU according to the corresponding drive signals g*#. In other words, the control unit 14 is designed to alternately turn on the high-side switching element S*p of one leg (phase) and the low-side switching element S*n of the same leg (phase). This drive alternately closes the conductive path between the collector and emitter of the high-side switching element S*p of one leg and the conductive path between the collector and emitter of the high-side switching element S*n of the same leg.

Next, an example of the circuit structure of each drive unit DU provided for a corresponding one switching element S*# will be described with reference to FIG. 2.

Figure 2:
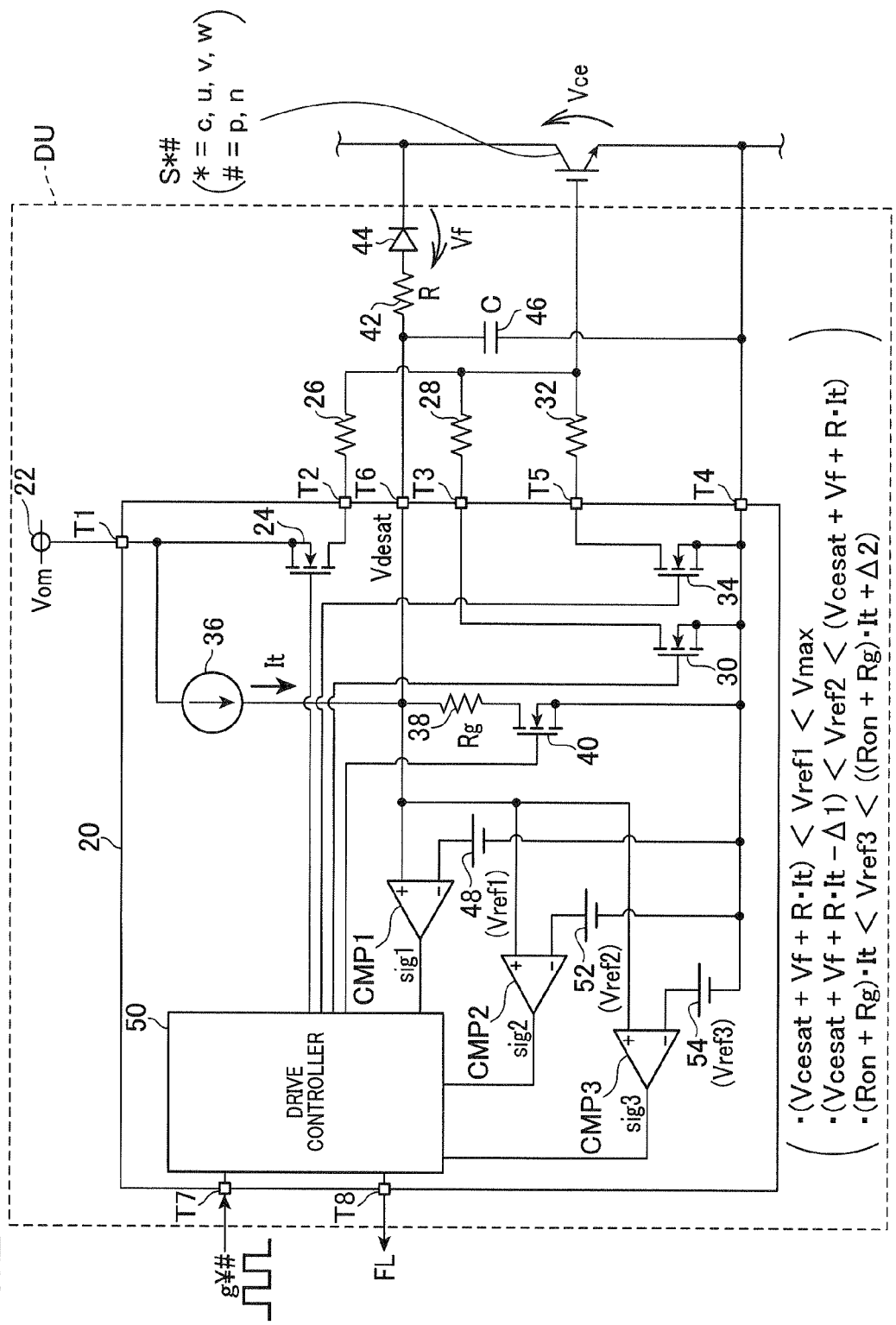
FIG. 2 is a circuit diagram schematically illustrating an example of the structure of each drive unit of the control system illustrated in FIG. 1.

Referring to FIG. 2, the drive unit DU is comprised of a drive IC 20 on a chip, an external constant voltage source 22, a charging resistor 26, a discharging resistor 28, a soft-turnoff resistor 32, a resistor 42, a diode 44, and a capacitor 46.

The drive IC 20 has terminals T1 to T8, a charging switching element (SW) 24, a discharge switching element (SW) 30, a soft-turnoff switching element (SW) 34, a constant current source 36, a resistor 38, and a reset switching element (SW) 40. The drive IC 20 also has a first power supply source 48, a drive controller 50, a second power supply source 52, a third power supply source 54, a first comparator CMP1, a second comparator CMP2, and a third comparator CMP3. As the charging switching element 24, a P-channel MOSFET is used, and as each of the switching elements 30, 34, and 40, an N-channel MOSFET is used.

The external constant voltage source 22 having a terminal voltage Vom of, for example, 15 V thereacross is connected to the terminal T1. The terminal T1 is connected to the terminal T2 via the charging switching element 24. The terminal T2 is connected to the on-off control terminal, i.e. the gate, of the switching element S*# via the charging resistor 26. That is, the source of the charging switching element 24 is connected to the terminal T1, the drain of the charging switching element 20 is connected to the terminal T2, and the gate thereof is connected to the drive controller 50.

The gate of the switching element S*# is connected to the terminal T3 via the discharging resistor 28, and the terminal T3 is connected to the terminal T4 via the discharging switching element 30. The terminal T4 is connected to the output terminal, i.e. the emitter, of the switching element S*# via a common reference-potential line. In this embodiment, the potential at the emitter of the switching element S*# is set to 0 V. That is, the drain of the discharging switching element 30 is connected to the terminal T3, the source of the discharging switching element 30 is connected to the terminal T4, and the gate thereof is connected to the drive controller 50.

The gate of the switching element S*# is further connected to the terminal T4 via the soft-turnoff resistor 32, the terminal T5, and the soft-turnoff switching element 34. That is, the drain of the soft-turnoff switching element 34 is connected to the terminal T5, the source of the soft-turnoff switching element 34 is connected to the terminal T4, and the gate thereof is connected to the drive controller 50.

The terminal T1 is connected to the terminal T4 via the constant current source 36, the resistor 38 and the reset switching element 40 to the terminal T4. That is, the drain of the reset switching element 40 is connected to the resistor 38, the source of the reset switching element 40 is connected to the terminal T4, and the gate thereof is connected to the drive controller 50.

The connection point between the constant current source 36 and the resistor 38 is connected to the terminal T6. The terminal T6 is connected to the input terminal, i.e. the collector, of the switching element S*# via the resistor 42 and the diode 44; the resistor 42 and diode 44 are provided externally to the drive IC 20. As the diode 44, a high-voltage diode is used. Specifically, the anode of the diode 44 is connected to one end of the resistor 42, and the cathode is connected to the collector of the switching element S*#. The connection point between the terminal T6 and the other end of the resistor 42 is connected to the emitter of the switching element S*# via the capacitor 46 provided externally to the drive IC 20. Note that the diode 44 serves as a rectifier that prevents a collector current flowing between the collector and emitter of the switching element S*# from flowing toward the drive IC 20, thus avoiding the reliability of the drive ID from being lowered. The resistor 42 is a resistive element serving to prevent noise from being transferred from the collector of the switching element S*# to the terminal T6, thus avoiding drop of the reliability of the drive IC 20. Specifically, the resistor 42 and the capacitor 46 serve as a low-pass filter to shut off the transfer of noise to the drive IC 20.

The terminal T6 is connected to a non-inverting input terminal of the first comparator CMP1. To an inverting input terminal of the first comparator CMP1, the positive terminal of the power supply source 48 having a first reference voltage Vref1 as a terminal voltage thereacross is connected. The negative terminal of the power supply source 48 is connected to the terminal T4. An output terminal of the first comparator CMP1 is connected to the drive controller 50, so that an output signal of the first comparator CMP1 is input to the drive controller 50 as a first determination signal Sig1. That is, the output signal of the first comparator CMP1 is defined as the subtraction of the first reference voltage Vref1 from the voltage at the terminal T6. Thus, a logical high level is output from the first comparator CMP1 if the voltage at the terminal T6 is higher than the first reference voltage Vref1, and a logical low level is output from the first comparator CMP1 if the voltage at the terminal T6 is lower than the first reference voltage Vref1.

The terminal T6 is also connected to a non-inverting input terminal of each of the second and third comparators CMP2 and CMP3. To an inverting input terminal of the second comparator CMP2, the positive terminal of the power supply source 52 having a second reference voltage Vref2 as a terminal voltage thereacross is connected. To an inverting input terminal of the third comparator CMP3, the positive terminal of the power supply source 54 having a third reference voltage Vref3 as a terminal voltage thereacross is connected. The negative terminal of each of the power supply sources 52 and 54 is connected to the terminal T4. An output terminal of the second comparator CMP2 is connected to the drive controller 50, so that an output signal of the second comparator CMP2 is input to the drive controller 50 as a second determination signal Sig2. That is, the output signal of the second comparator CMP2 is defined as the subtraction of the second reference voltage Vref2 from the voltage at the terminal T6. Thus, a logical high level is output from the second comparator CMP2 if the voltage at the terminal T6 is higher than the second reference voltage Vref2, and a logical low level is output from the second comparator CMP2 if the voltage at the terminal T6 is lower than the second reference voltage Vref2.

An output terminal of the third comparator CMP3 is connected to the drive controller 50, so that an output signal of the third comparator CMP3 is input to the drive controller 50 as a third determination signal Sig3. That is, the output signal of the third comparator CMP3 is defined as the subtraction of the third reference voltage Vref3 from the voltage at the terminal T6. Thus, a logical high level is output from the third comparator CMP3 if the voltage at the terminal T6 is higher than the third reference voltage Vref13 and a logical low level is output from the third comparator CMP3 if the voltage at the terminal T6 is lower than the third reference voltage Vref3.

Specifically, the non-inverting input terminals of the first to third comparators CMP1 to CMP3 are connected to the anode of the diode 44 via a first electrical path. The first electrical path is connected to the emitter of the switching element S*# via a second electrical path on which the resistor 38 and the reset switching element 40 are provided.

Next, a charging task and a discharging task for the gate of each switching element S*# carried out by the drive controller 50 of a corresponding drive unit DU will be described hereinafter.

First, the charging task will be described hereinafter.

The charging task for the gate of the switching element S*# is to output a drive signal g*# with one of a high level and low level to the charging switching element 24 as an on-drive command to thereby turn on the charging switching element 24 and turn off the discharging switching element 30. The charging task enables the constant voltage source 22 to store electrical charge on the gate of the switching element S*# to thereby charge it, resulting in shift of the switching element S*# from an off state to an on state.

On the other hand, the discharging task for the gate of the switching element S*# is to output a drive signal g*# with the other of the high level and low level to the charging switching element 24 as an off-drive command to thereby turn off the charging switching element 24 and turn of the discharging switching element 30. The discharging task dissipates the electrical charge stored on the gate of the switching element S*# therefrom to thereby discharge it, resulting in shift of the switching element S*# from the on state to the off state.

Next, an overcurrent protection task carried out by the drive controller 50 will be described hereinafter.

The overcurrent protection task is configured to switch the soft-turnoff switching element 34 from an off state to an on state to thereby forcibly turn off the switching element S*# if it is determined, based on a non-saturated voltage between the collector and emitter of the switching element S*#, that the level of the collector current is equal to or higher than a threshold level. Note that the desaturation voltage between the collector and emitter of the switching element S*# means the voltage between the collector and the emitter of the switching element S*# in its desaturation region within which the collector current increases with an increase in voltage between the collector and emitter of the switching element S*#. The threshold level means an upper limit for the collector current; if the level of the collector current is kept to be equal to or lower than the threshold level, the reliability of the switching element S*# can be maintained.

Figure 3:
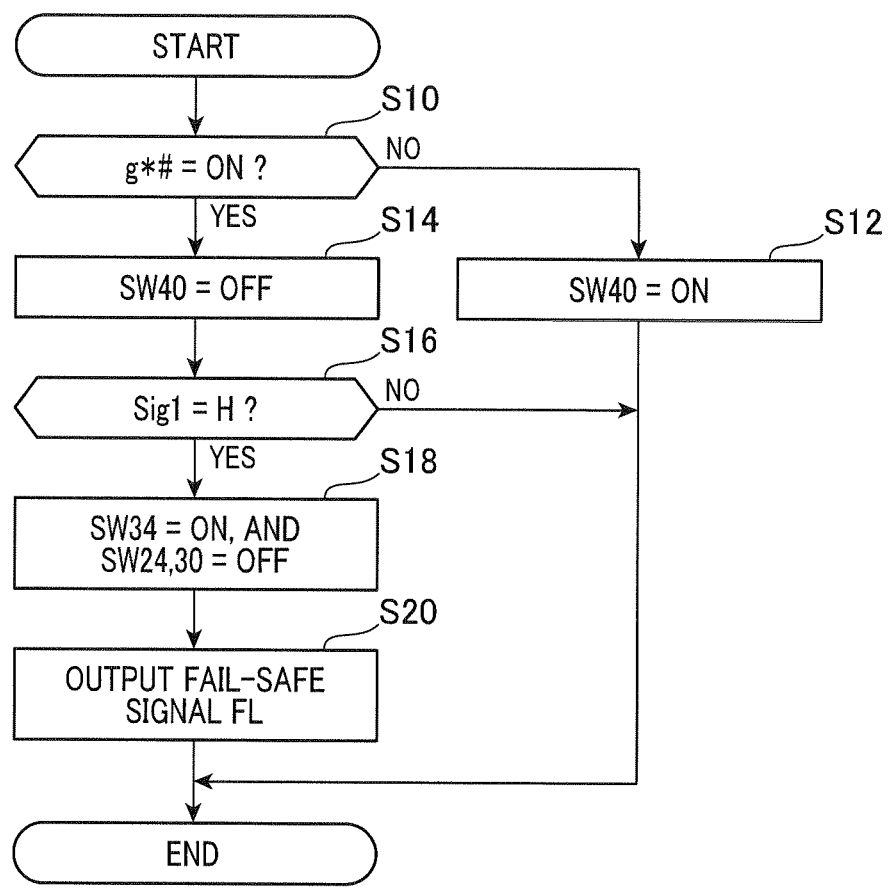
FIG. 3 is a flowchart schematically illustrating an example of an overcurrent protection routine carried out by each drive unit of the control system illustrated in FIG. 1.

An example of a specific routine for the overcurrent protection task according to this embodiment will be described hereinafter with reference to FIG. 3. Note that the drive controller 50 of each drive unit DU can be configured as a programmed logic circuit, a hard-wired logic circuit, or the combination of hardwired-logic and programmed-logic hybrid circuits, and repeatedly carry out the routine, i.e. the overcurrent protection routine.

When launching the overcurrent protection routine, the drive controller 50 determines whether the drive signal g*# for the switching element S*# is the on-drive command in step S10.

Upon determination that the drive signal g*# for the switching element S*# is not the on-drive command (NO in step S10), the routine proceeds to step S12. In step S12, the drive controller 50 turns or keeps on the reset switching element 40 to enable the second electrical path to be closed. The on state of the switching element S*# enables a constant current output from the constant current source 36 to flow through the reset switching element 40 without flowing through the terminal T6 and the capacitor C. This prevents, if the converter CV and/or the inverter IV is used again after it was determined that an overcurrent flowed through the switching element S*# by this routine described later, incorrect determination that an overcurrent flows through the switching element S*# again due to a high potential difference across the capacitor 46.

Otherwise, upon determination that the drive signal g*# for the switching element S*# is the on-drive command (YES in step S10), the routine proceeds to step S14. In step S14, the drive controller 50 turns off the reset switching element 40 to open the second electrical path, so that the constant current output from the constant current source 36 flows through the terminal T6 and the capacitor 46, charging the capacitor 46.

Next, the drive controller 50 determines whether the first determination signal Sig1 is the logical high level in step S16. This operation is to determine whether an overcurrent flows between the collector and emitter of the switching element S*#. Hereinafter, how to determine whether an overcurrent flows between the collector and emitter of the switching element S*# will be described.

Switching the drive signal g*# from the off-drive command to the on-drive command starts the charging task to charge the gate of the switching element S*#, resulting in an increase of the gate voltage, i.e. the gate-emitter voltage, Vge. Switching the drive signal g*# from the off-drive command to the on-drive command also charges the capacitor 46 based on the constant current output from the constant current source 36, resulting in an increase of the potential difference across the capacitor 46, i.e. an increase of a voltage Vdesat at the terminal T6.

Thereafter, the collector-emitter voltage Vce is kept at a high level before the gate voltage Vge reaches a threshold voltage for switching the switching element S*# to the on state. For this reason, the potential at the anode of the diode 44 is lower than the potential at the collector of the switching element S*#, so that the diode 44 prevents a current from flowing from the terminal T6 toward the collector via the diode 44. This enables the voltage Vdesat at the terminal T6 to continuously increase. Thereafter, when the gate voltage Vge exceeds the threshold voltage, the switching element S*# is turned from the off state to the on state.

At that time, if no overcurrent flows through the switching element S*#, the turn-on of the switching element S*# causes the on resistance of the switching element S*# to become very low, resulting in drop of the collector-emitter voltage Vce down to a very low level of, for example, 1 V. The very-low collector-emitter voltage Vce causes the potential at the collector to fall toward that at the emitter, so that the potential at the collector, i.e. the collector-emitter voltage Vce, becomes lower than the potential at the anode of the diode 44.

In this embodiment, the first reference voltage Vref1 is established to be higher than a first prescribed voltage and lower than the maximum level Vmax of the collector-emitter voltage Vce. The first prescribed voltage means the sum of:

a level, for example, 1 V, of the collector-emitter voltage Vce while no overcurrent flows through the switching element S*# being in the on state;

the forward voltage Vf of the diode 44; and the product of the resistance R of the resistor 42 and a constant current value It based on the constant current source 36.

The level of the collector-emitter voltage Vce while no overcurrent flows through the switching element S*# being in the on state will be referred to as the on level Vcesat. The maximum level Vmax of the collector-emitter voltage Vce represents a level of the collector-emitter voltage Vce when the level of the collector becomes the threshold level. Thus, the first reference voltage Vref1 is given by the following equation:

$$(Vcesat + Vf + R \cdot It) < Vref1 < Vmax$$

The first threshold voltage Vref 1 established set forth above causes the electrical charge stored in the capacitor 46, which are used to measure an overcurrent, to be dissipated toward the collector of the switching element S*# via the diode 44, so that the voltage Vdesat at the terminal T6 falls up to the first prescribed voltage. This prevents the voltage Vdesat at the terminal T6 from reaching the first reference voltage Vref1 during the duration of the drive signal g*# being the on-drive command. Because the first determination signal Sig1 is defined by the subtraction of the first reference voltage Vref1 from the voltage Vdesat, the first determination signal Sig1 is kept at the logical low level.

On the other hand, if an overcurrent flows the switching element S*#, the gate voltage Vge exceeds the threshold voltage, resulting in a high level of the collector-emitter voltage Vce due to a high level of the collector current despite the turn-on of the switching element S*#. For this reason, the potential at the anode of the diode 44 becomes lower than that at the collector of the switching element S*#, blocking the transfer of current from the terminal T6 to the collector of the switching element S*# via the diode 44. This enables the constant current to be continuously supplied from the constant current source 36 to the capacitor 46 despite the turn-on of the switching element S*#, so that the voltage Vdesat at the terminal T6 exceeds the first reference voltage Vref1. As a result, the first determination signal Sig1 is reversed from the logical low level to the logical high level. The reverse of the first determination signal Sig1 from the logical low level to the logical high level allows the drive controller 50 to determine that an overcurrent flows through the switching element S*#.

Note that the forward voltage Vf of the diode 44 is, for example, defined as a level of the forward voltage thereof when the constant current from the constant current source 36 flows through the diode 44. The maximum level Vmax seems to increase as the temperature of the switching element S*# rises. For this reason, the first reference voltage Vref 1 can be established based on the maximum level Vmax of the collector-emitter voltage Vce when the temperature of the switching element S*# becomes a lower limit of the available temperature range of the switching element S*#.

The constant current value It output from the constant current source 36 and the capacitance C of the capacitor 46 are for example defined in terms of:

the constant current value It and the capacitance C are not excessively increased; and the voltage Vdesat at the terminal T6 does not exceed the first reference voltage Vref1.

When it is determined that the first determination signal Sig1 is the logical high level (YES in step S16), the routine proceeds to step S18. In step S18, the drive controller 50 switches the soft-turnoff switching element 34 from the off state to the on state, and switches each of the charging and discharging switching elements 24 and 30 from the on state to the off state. The operation in step S18 enables the electrical charge stored on the gate of the switching element S*# to be dissipated therefrom via the soft-turnoff resistor 32, so that the switching element S*# is forcibly switched from the on state to the off state. The soft-turnoff resistor 32 serves to increase the resistance of a discharge path of the gate therethrough in comparison to the resistance of a discharge path of the gate through the discharging resistor 28. Specifically, the resistance of the soft-turnoff resistor 32 is set to be higher than that of the discharging resistor 28. If a high level collector current flowed through the switching element S*#, increasing the rate of change of the switching element S*# from the on state to the off state, i.e. the shutoff rate between the collector and emitter of the switching element S*# may excessively increase a surge produced within the period during which the switching element S*# is changed from the on state to the off state. Thus, the soft-turnoff resistor 32 serves to reduce the rage of change of the switching element S*# from the on state to the off state, thus preventing a surge from excessively rising.

Next, in step S20, the drive controller 50 outputs a fail-safe signal FL for the switching element S*# to the low-voltage system, i.e. the control unit 14, via the terminal T8; the fail-safe signal FL represents that an overcurrent flows through the switching element S*#. In this embodiment, the control unit 14 includes a fail-safe unit 14a. The fail-safe signal FL is inputted to the fail-safe unit 14a, and the fail-safe unit 14a shuts down each of the inverter INV and the converter CNV.

On the other hand, when it is determined that the first determination signal Sig1 is the logical low level (NO in step S16), or when the operation in step S12 or step S20 is completed, the drive controller 50 terminates the routine.

Figure 4:
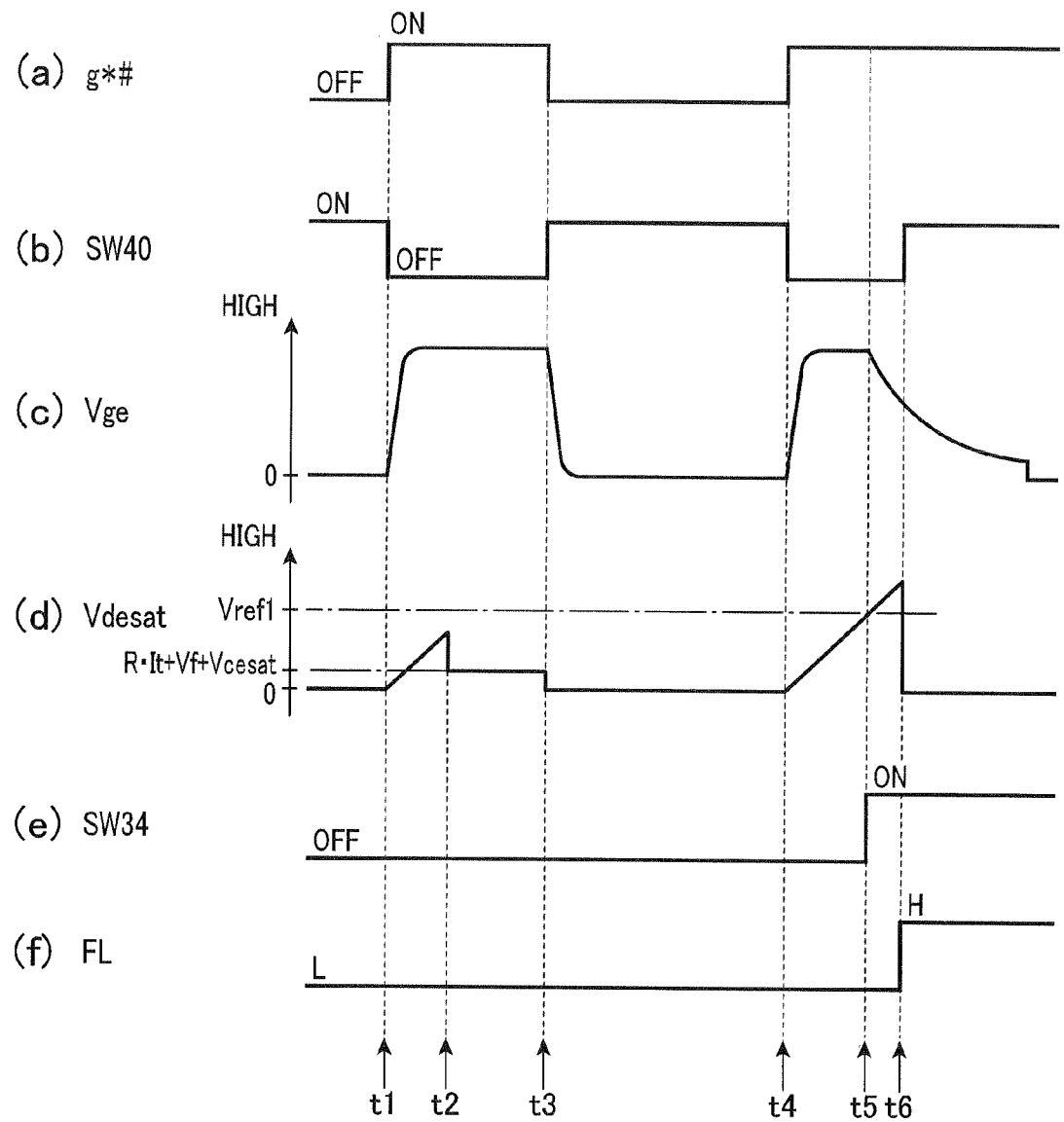
FIG. 4 is a timing chart schematically illustrating an example of specific steps of the overcurrent protection routine carried out by each drive unit.

FIG. 4 schematically illustrates specific steps of the overcurrent protection routine by the drive controller 50 of the drive unit DU. How the drive signal g*# varies is illustrated in (a) of FIG. 4, and how the reset switching element 40 is driven is illustrated in (b) of FIG. 4. How the gate voltage Vge varies is illustrated in (c) of FIG. 4, and the voltage Vdesat at the terminal T6 varies is illustrated in (d) of FIG. 4. How the soft-turnoff switching element 40 is driven is illustrated in (e) of FIG. 4, and how the fail-safe signal FL varies is illustrated in (f) of FIG. 4.

Referring to FIG. 4, when the drive signal g*# is changed from the off-drive command to the on-drive command at time t1, the reset switching element 40 is changed from the on state to the off state, and each of the gate voltage Vge and the voltage Vdesat at the terminal T6 starts to rise at the time t1 (see steps S10 and S14). Thereafter, when the gate voltage Vge exceeds the threshold voltage, the switching element S*# is changed from the off state to the on state, so that the electrical charge stored in the capacitor 46 has been dissipated therefrom to the collector of the switching element S*# at time t2. This results in drop of the voltage Vdesat at the terminal T6 up to the first prescribed voltage. Thereafter, when the drive signal g*# is switched from the on state to the off state at time t3, the reset switching element 40 is switched from the off state to the on state, and the gate voltage Vge drops. The voltage drop of the gate voltage Vge causes the switching element S*# to be switched from the on state to the off state.

Thereafter, when the drive signal g*# is switched from the off state to the on state at time t4, each of the gate voltage Vge and the voltage Vdesat at the terminal T6 starts to rise. At that time, if an overcurrent flows through the switching element S*#, the level of the collector current flowing through the switching element S*# exceeds the threshold level, so that the voltage Vdesat at the terminal T6 exceeds the first reference voltage Vref1 at time t5. This causes the soft-turnoff switching element 34 to be switched from the off state to the on state, so that the soft-turnoff operation to forcibly turn off the switching element S*# is performed (see step S18).

Thereafter, the fail-safe signal FL is output from the drive controller 50 to the control unit 14 at time t6, so that the inverter IV and the converter CV are shut down. Thereafter, the reset switching element 40 is switched from the off state to the on state to discharge the capacitor 46, which is ready to the case where the inverter IV and the converter CV will be activated.

As described above, at least the diode 44, capacitor 46, and resistor 42, which are provided externally to the drive IC 20, constitute discharging means serving as a function of determining whether an overcurrent flows through the switching element S*# by dissipating electrical charge used to measure an overcurrent. If there is a failure in the discharging means, i.e. the overcurrent determining function, it may be difficult to measure an overcurrent flowing between the collector and emitter of the switching element S*#. This may make it difficult to perform the fail-safe task set forth above, such as the task to shut down the converter CV and the inverter IV, resulting in drop of the reliability of the switching element S*#.

Figure 5:
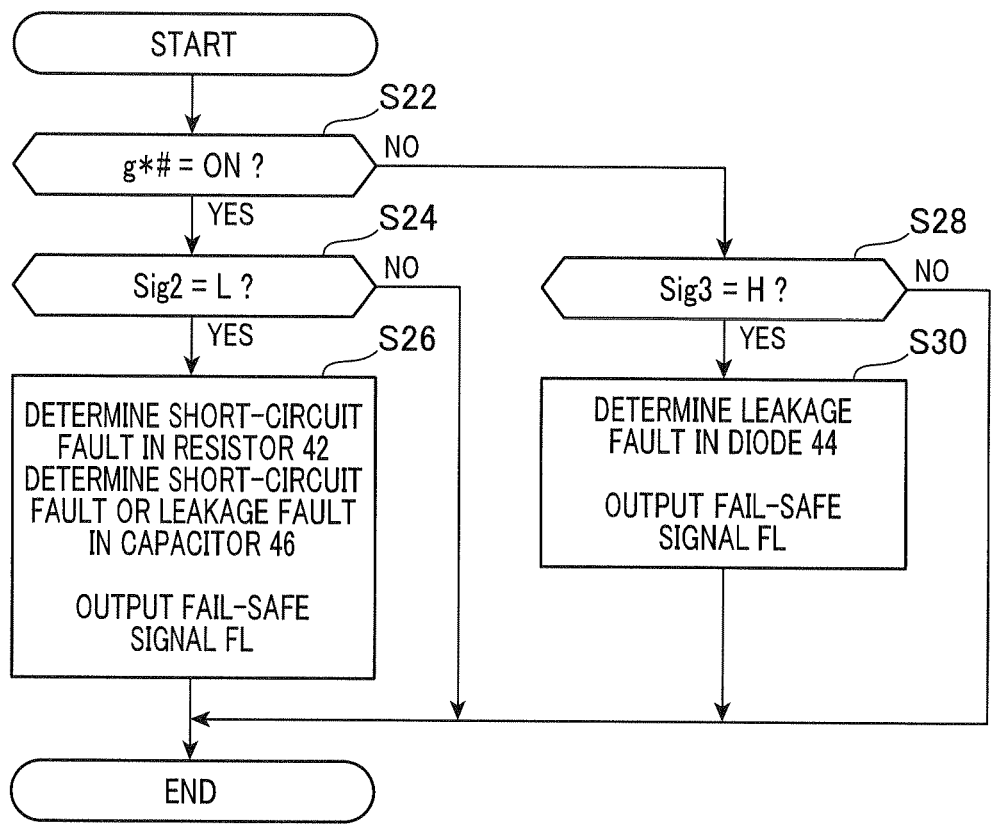
FIG. 5 is a flowchart schematically illustrating an example of a failure determining routine carried out by each drive unit of the control system illustrated in FIG. 1.

In order to address such a problem, the drive controller 50 of each drive unit DU is configured to perform a failure determining routine for determining whether there is a failure in the overcurrent determining function as illustrated in FIG. 5. Note that the drive controller 50 of each drive unit DU can be configured as a programmed logic circuit, a hard-wired logic circuit, or the combination of hardwired-logic and programmed-logic hybrid circuits, and repeatedly carry out the abnormality determination routine.

When the failure determining routine, the drive controller 50 deter mines whether the drive signal g*# for the switching element S*# is the on-drive command in step S22. When it is determined that the drive signal g*# for the switching element S*# is the on-drive command (YES in step S22), the routine proceeds to step S24.

In step S24, the drive controller 50 determines whether the second determination signal Sig2 is the logical low level. This operation is to determine whether there is an insulation failure, such as a short-circuit failure or a leakage failure, in the capacitor 46, or there is a short-circuit failure in the resistor 42. Note that the short-circuit failure in the capacitor 46 means a failure in which the two electrodes of the capacitor 46, which are separated and insulated from each other, are short-circuited. The leakage failure in the capacitor 46 means a failure in which a leakage current flows between the two electrodes of the capacitor 46 due to an insulation failure between the two electrodes although the two electrodes are not short-circuited.

Hereinafter, how to determine whether there is a failure in the function of determining whether an overcurrent flows through the switching element S*# will be described.

In this embodiment, the second reference voltage Vref2 of the second power supply source 52 is established to be lower than the first prescribed voltage; the first prescribed voltage means, as described above, the sum of:

the on level Vcesat;
the forward voltage Vf of the diode 44; and
the product of the resistance R of the resistor 42 and the constant current value It based on the constant current source 36.

In addition, the second reference voltage Vref2 is established to be higher than a predetermined voltage slightly lower than the first prescribed voltage. Specifically, the second threshold voltage Vref2 is established to be higher than the subtraction of a preset positive level Δ1 from the first prescribed voltage. Thus, the second reference voltage Vref2 is given by the following equation:

$$(Vcesat+Vf+R \cdot It - \Delta 1) < Vref2 < (Vcesat + Vf + R \cdot It)$$

The establishment of the second reference voltage Vref2 enables, if there are no failures in the overcurrent determining function during the on-drive state of the drive signal g*#, the voltage Vdesat at the terminal T6 to become the first prescribed voltage higher than the second reference voltage Vref2.

This results in the second determination signal Sig2 being set to the logical high level because the second determination signal Sig2 is the subtraction of the second reference voltage Vref2 from the voltage Vdesat at the terminal T6.

In contrast, if there is a short-circuit failure in the capacitor 46 during the on-drive state of the drive signal g*#, the terminal T6 and the emitter of the switching element S*# are short-circuited, so that the voltage Vdesat at the terminal T6 is fixed to 0 V. This results in the second determination signal Sig2 being reversed to the logical low level because the second determination signal Sig2 is the subtraction of the second reference voltage vref2 from the voltage Vdesat at the terminal T6.

In addition, if there is a leakage failure in the capacitor 46 during the on-drive state of the drive signal g*#, the potential difference across the capacitor 46 is lower than the potential difference across the capacitor 46 that is obtained if there are no failures in the overcurrent determination function. For this reason, the voltage Vdesat at the terminal T6 during the on state of the switching element S*# is lower than the subtraction of the preset level Δ from the first prescribed voltage. This results in the second determination signal Sig2 being reversed to the logical low level because the second determination signal Sig2 is the subtraction of the second reference voltage vref2 from the voltage Vdesat at the terminal T6.

If there is a short-circuit failure in the resistor 42 during the on-drive state of the drive signal g*#, the voltage Vdesat at the terminal T6 during the on state of the switching element S*# falls up to the sum of the on level Vcesat and the forward voltage Vf of the diode 44. This results in the second determination signal Sig2 being reversed to the logical low level because the second determination signal Sig2 is the subtraction of the second reference voltage vref2 from the voltage Vdesat at the terminal T6.

As described above, the logical level of the second determination signal Sig2 allows the drive controller 50 to determine whether there is a failure in the overcurrent determining function, i.e. in the capacitor 46 and/or the resistor 42.

When it is determined that the second determination signal Sig2 is the logical low level (YES in step S24), the routine proceeds to step S26. In step S26, the drive controller 50 determines that there is a failure in the overcurrent determining function. That is, the drive controller 40 determines that there is a short-circuit failure or a leakage failure in the capacitor 46 or there is a short-circuit failure in the resistor 42. Then, in step S26, the drive controller 50 outputs the fail-safe signal FL to the low-voltage system, i.e. the control unit 14, via the terminal T8. The fail-safe signal FL represents that a failure occurs in the overcurrent determining function in the drive unit DU. The fail-safe signal FL is inputted to the fail-safe unit 14a, and the fail-safe unit 14a shuts down each of the inverter INV and the converter CNV, and/or performs a task to notify a user of the motor-generator 10 and the control system 100, such as a driver of the motor vehicle, of the occurrence of a failure in the overcurrent determining function.

Otherwise, when it is determined that the drive signal g*# for the switching element S*# is not the on-drive command (NO in step S22), the drive controller 50 determines that the drive signal g*# for the switching element S*# is the off-drive command, and performs the operation in step S28.

In step S28, the drive controller 50 determines whether the third determination signal Sig3 is the logical high level. This operation is to determine whether there is a leakage failure in the diode 44.

Hereinafter, how to determine whether there is a leakage failure in the diode 44 will be described.

In this embodiment, the third reference voltage Vref3 of the third power supply source 54 is established to be higher than a second prescribed voltage. The second prescribed voltage means the product of:

the constant current value It based on the constant current source 36; and
the sum of an on resistance Ron of the reset switching element 40 and the resistance Rg of the resistor 38.

In addition, the third reference voltage Vref3 is established to be lower than a predetermined voltage slightly higher than the second prescribed voltage. Specifically, the third reference voltage Vref3 is established to be higher than the sum of a preset positive level 42 and the second prescribed voltage. Thus, the third reference voltage Vref3 is given by the following equation:

$$(Ron+Rg) \cdot It < Vref3 < \{(Ron+Rg) \cdot It + \Delta 2\}$$

The establishment of the third reference voltage Vref3 enables, if there are no failures in the overcurrent determining function during the off-drive state of the drive signal g*#, a current flowing through the reset switching element 40 is the constant current level It based on the constant current source 36. For this reason, the voltage Vdesat at the terminal T6 is set to the product of:

the sum of the on resistance Ron of the reset switching element 40 and the resistance Rg of the resistor 38; and
the constant current level It based on the constant current source 36.

That is, the voltage Vdesat at the terminal T6 is equal to the second prescribed voltage lower than the third reference voltage Vref3.

This results in the third determination signal Sig3 being set to the logical low level because the third determination signal Sig3 is the subtraction of the third reference voltage Vref3 from the voltage Vdesat at the terminal T6.

In contrast, if there is a leakage failure in the diode 44 during the off-drive state of the drive signal g*#, a leakage current $I_{leak}$ flows from the collector of the switching element S*# through the diode 44, the resistor 42, and the resistor 38, and further flows through the reset switching element 40.

For this reason, the voltage Vdesat at the terminal T6 is set to the product of:

the sum of the on resistance Ron of the reset switching element 40 and the resistance Rg of the resistor 38; and the constant current level It based on the constant current source 36 and the leakage current $I_{leak}$.

That is, the voltage Vdesat at the terminal T6 is higher than the third reference voltage Vref3.

This results in the third determination signal Sig3 being reversed to the logical high level because the third determination signal Sig3 is the subtraction of the third reference voltage Vref3 from the voltage Vdesat at the terminal T6.

Note that the resistor 38 is provided for increasing the accuracy of detecting a leakage failure in the diode 44. That is, the constant current value It based on the constant current source 36 is normally set to be a low level, and the on resistance of the reset switching element 40 is very low, resulting in a very low level of the source-drain voltage of the reset switching element 40. Thus, serial connection of the resistor 38 to the reset switching element 40 causes the voltage at the terminal T6 to be higher than the potential at the emitter of the switching element S*#. This increases the accuracy of comparing in level the third reference voltage Vref3 with the voltage Vdesat at the terminal T6, resulting in an increase of the accuracy of detecting a leakage failure in the diode 44.

Upon determination that the third determination signal Sig3 is the logical high level (YES in step S28), the routine proceeds to step S30. In step S30, the drive controller 50 determines that there is a leakage failure in the diode 44. Then, in step S30, the drive controller 50 outputs the fail-safe signal FL to the low-voltage system, i.e. the control unit 14, via the terminal T8. The fail-safe signal FL indicates that a leakage failure occurs in the diode 44. The fail-safe signal FL is inputted to the fail-safe unit 14a, and the fail-safe unit 14a shuts down each of the inverter INV and the converter CNV, and/or performs a task to give the occurrence of a leakage failure in the diode 44 to a user of the motor-generator 10 and the control system 100, such as a driver of the motor vehicle.

On the other hand, when it is determined that the second determination signal Sig2 is the logical high level (NO in step S24) or the third determination signal Sig3 is the logical low level (NO in step S28), or when the operation in step S26 or step S30 is completed, the drive controller 50 terminates the routine.

Note that failures in the overcurrent determining function include an open fault in the resistor 42, the diode 44, the capacitor 46, or an electrical path connecting between the collector of the switching element S*# and the terminal T6. The drive controller 50 performs the operation in step S16 to thereby determine whether there is an open fault in the resistor 42, the diode 44, or the electrical path between the collector of the switching element S*# and the terminal T6.

Specifically, if an open fault occurs in the resistor 42, the diode 44, or the electrical path, the electrical charge stored in the capacitor 46 has not been dissipated therefrom toward the collector of the switching element S*# although the switching element S*# is changed from the off state to the on state. For this reason, the first determination signal S*# is reversed from the logical low level to the logical high level, so that the determination in step S16 is affirmative.

In addition, if an open fault occurs in the capacitor 46, the voltage Vdesat at the terminal T6 during the on-drive state of the drive signal g*# is maintained at the terminal voltage Vom of the constant voltage source 22. For this reason, the first determination signal S*# is reversed from the logical low level to the logical high level, so that the determination in step S16 is affirmative.

As described above, the drive unit DU provided for each switching element S*# according to this embodiment is configured to determine that there is a short-circuit failure or a leakage failure in the capacitor 46 or that there is a short-circuit failure in the resistor 42 by determining that the second determination signal Sig2 is the logical low level during the on-drive state of the drive signal g*#. In addition, the drive unit DU provided for each switching element S*# according to this embodiment is configured to determine that there is a leakage failure in the diode 44 by determining that the third determination signal Sig3 is the logical high level during the off-drive state of the drive signal g*#.

This configuration makes it possible to reliably determine that there is a failure in the overcurrent determining function of the drive unit DU.

The drive unit DU provided for each switching element S*# according to this embodiment is configured such that the terminal T6 and the reset switching element 40 are connected to each other via the resistor 38. This configuration results in an increase of the accuracy of detecting the occurrence of a leak failure in the diode 44.

The drive unit DU provided for each switching element S*# according to this embodiment is configured such that the constant current source 36 applies a voltage to the connection point between the capacitor 46 and the resistor 42. This configuration enables a current flowing through the diode 44, the resistor 38, the resistor 42, or the reset switching element 40 to be easily determined while the drive unit DU performs the failure determining routine. Thus, it is possible to easily define each of the second and third reference voltages Vref2 and Vref3 as a function of the constant current based on the constant current source 36.

The drive unit DU provided for each switching element S*# according to this embodiment is configured to output a fail-safe signal FL if it is determined that there is a failure in the overcurrent determining function. This configuration makes it possible to reliably perform a fail-safe task against the failure in the overcurrent determining function in response to the fail-safe signal FL.

The drive units DU and the control system according to this embodiment can be modified.

The resistor 42 can be eliminated. In this modification, the second reference voltage Vref2 is preferably established to be lower than the sum of the on level Vcesat and the forward voltage Vf of the diode 44 and higher than the potential at the emitter of the switching element S*#.

The resistor 38 can be eliminated. In this modification, the third reference voltage Vref2 is preferably established to be higher than the product of the on resistance Ron of the reset switching element 40 and the constant current level It based on the constant current source 36.

The location of the resistor 38 can be changed to the electrical path between the source of the reset switching element 40 and the terminal T4.

Figure 6:
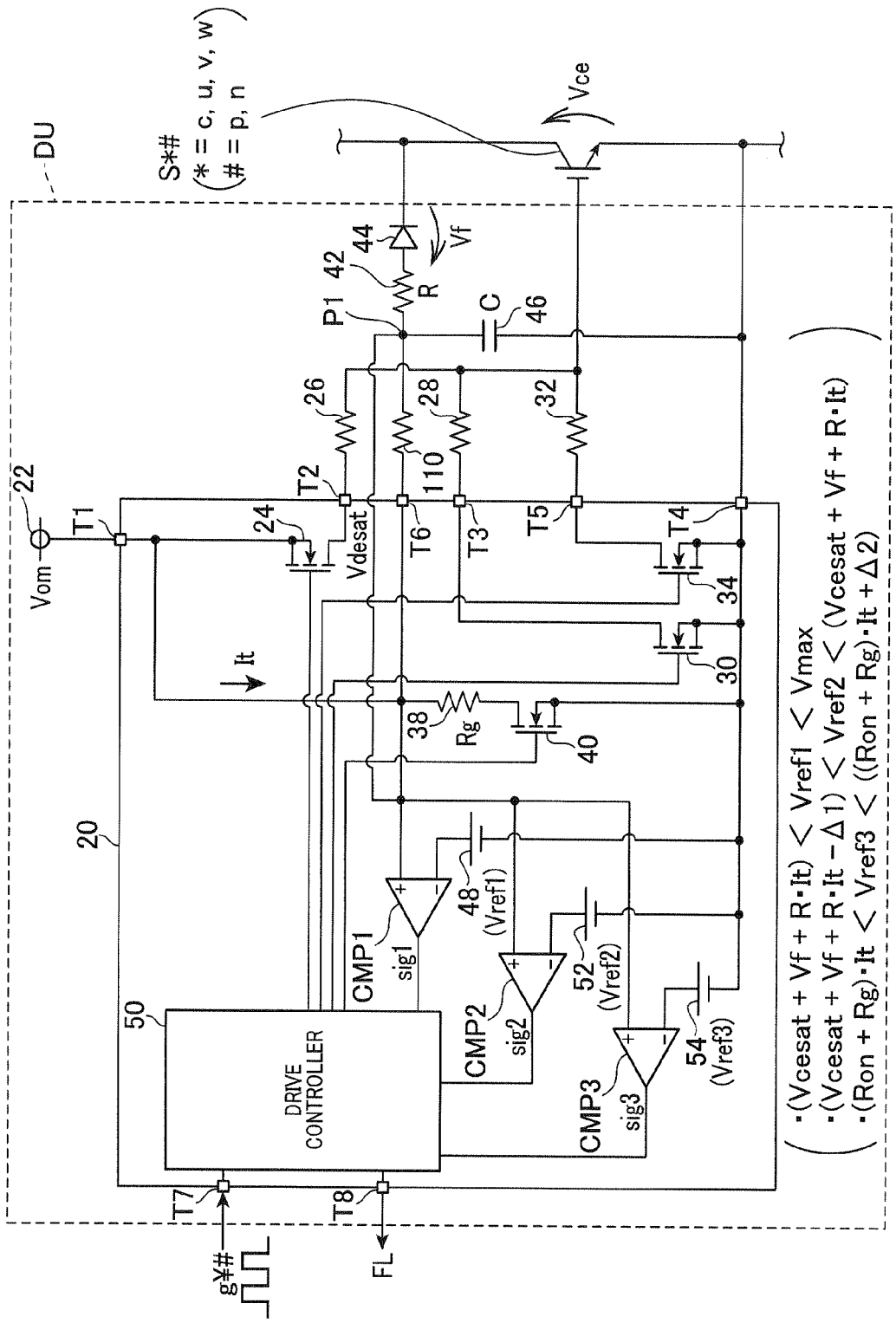
FIG. 6 is a circuit diagram schematically illustrating an example of the structure of each drive unit of a control system according to a modification of the embodiment.

As illustrated in FIG. 6, the constant current source 36 can be eliminated, so that the terminal T1 is directly connected to the resistor 38. In this modification, a resistor 110, serving as a delay resistor, is provided between the terminal T6 and the connection point P1 between the capacitor 46 and the other end of the resistor 42. In this modification, the non-inverting input terminal of each of the first to third comparators CMP1 to CMP3 is connected to the connection point P1 between the other end of the resistor 42 and the capacitor 46, so that wiring between the non-inverting input terminal of each of the first to third comparators CMP1 to CMP3 and the terminal T6 is eliminated.

In this modification, a potential at the connection point P1 can used, in place of the voltage Vdesat at the terminal T6, to determine whether there is fault in the overcurrent determining function.

The delay resistor 110 has a purpose of preventing the potential at the connection point between the delay resistor 110 and the capacitor 46 from exceeding the reference voltage Vref1 during the period from when the drive signal g*# is changed to the on-drive command to when the switching element S*# is switched to the on state. For example, adjusting the resistance of the delay resistor 110 and the capacitance C of the capacitor 46 to adjust the time constant of the RC circuit including the delay resistor 110 and the capacitor 46 achieves the purpose.

Figure 7:
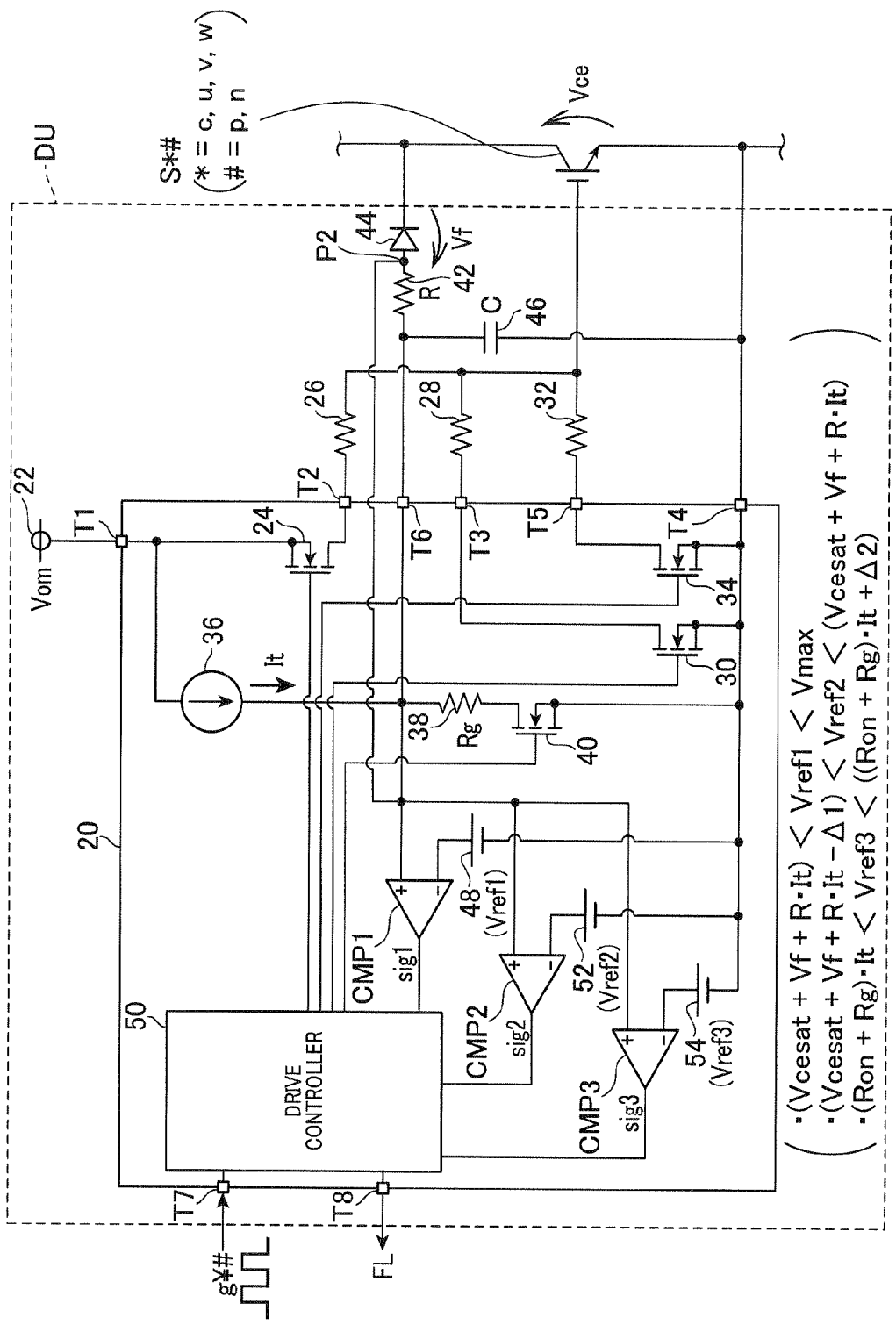
FIG. 7 is a circuit diagram schematically illustrating an example of the structure of each drive unit of a control system according to another modification of the embodiment.

The potential Vdesat at the terminal T6 is used to determine whether there is fault in the overcurrent determining function, but another potential can be used. For example, as illustrated in FIG. 7, the connection point P2 between the one end of the resistor 42 and the anode of the diode 44 is connected to the non-inverting input terminal of each of the first to third comparators CMP1 to CMP3, so that wiring between the non-inverting input terminal of each of the first to third comparators CMP1 to CMP3 and the terminal T6 is eliminated. The potential at the connection point P2 between the resistor 42 and the diode 44 can be used, in place of the potential Vdesat at the terminal T6, to determine whether there is fault in the overcurrent determining function. In this modification, the sum of the on level Vcesat and the forward voltage Vf of the diode 44 should be used as the prescribed voltage. In this modification, however, a short-circuit failure in the resistor 42 cannot be detected.

The second reference voltage Vref2 can be set to be slightly higher than 0 V. Specifically, the second reference voltage Vref2 can be set to be lower than the sum of the on level Vcesat and the forward voltage Vf of the diode 44, and higher than 0 V. In this modification, if it is determined that the second determination signal Sig2 is the logical low level (YES in step S24), the drive controller 50 determines that there is a short-circuit failure in the capacitor 46.

Information about variations in at least one of the parameters including: the on level Vcesat, the constant current value It based on the constant current source 36, the forward voltage Vf of the diode 44, the resistance R of the resistor 42, the resistance Rg of the resistor 38; and the on resistance Ron of the reset switching element 40, of the drive units DU provided for the respective switching elements S*# can be previously determined. In this modification, the first to third reference voltages Vref1 to Vref3 for each of the switching elements S*# can be established based on the information. In this modification, it is possible to reduce adverse effects of the variations in at least one of the parameters of the mass-produced switching elements S*# on the establishment of the first to third reference voltages Vref1 to Vref3, thus further improving the accuracy of determining whether there is a failure in the overcurrent determining function.

The circuit configuration of each drive unit DU for determining whether an overcurrent flows through the switching element S*# is not limited to that illustrated in FIG. 2.

Figure 8:
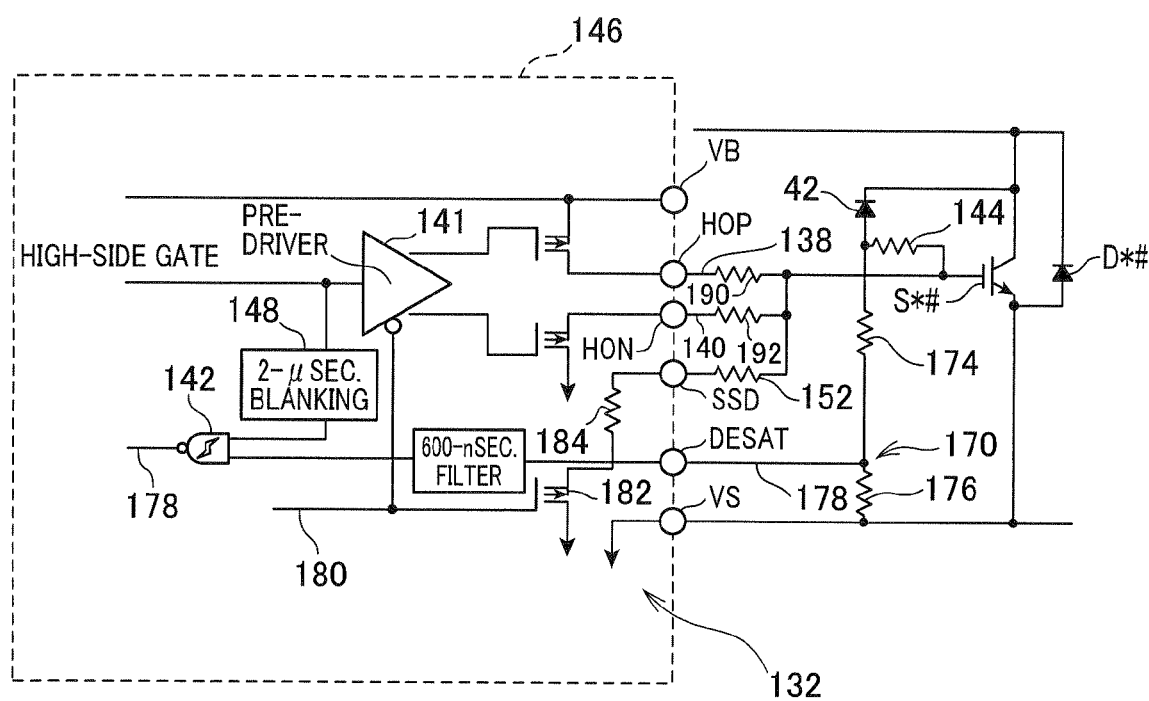
FIG. 8 is a circuit diagram schematically illustrating an example of the structure of each drive unit of the control system according to a further modification of the embodiment.

For example, FIG. 8 schematically illustrates another example of the circuit configuration of a drive unit DU according to a modification of the embodiment. Referring to FIG. 8, the drive unit DU is comprised of a gate driver circuit 146 including a drive circuit block 132 connected to the corresponding switching element S*#. The drive circuit block 132 gives a switching signal with a pulse-width modulated waveform to each of a driver pull-up output 138 and a driver pull-down output 140.

If an overcurrent flows through the switching element S*#, a voltage at the common connection point between the resistors 174 and 176 is transferred to a desaturation fault logic circuit 142. An overcurrent can be detected based on a desaturation voltage between the collector and emitter of the switching element S*#, the voltage across the detection resistor 144, or both the desaturation voltage and the voltage across the detection resistor 144. If the desaturation fault logic circuit 142 detects that an overcurrent flows through the switching element S*#, i.e. outputs a fault detection signal, soft turn-off operation for the switching element S*# is started.

The switching element S*# is turn off slowly by a high-impedance series resistor 152 connected to the gate driver circuit 146.

As illustrated in FIG. 8, the diode 42 and the pair of resistors 174 and 176 connecting the anode of the diode 42 and the emitter of the switching element S*# constitute discharging means serving as a function of determining whether an overcurrent flows through the switching element S*#. The failure determining routine in the circuit configuration of drive unit DU is programmed to determine whether there is a failure in the pair of resistors 174 and 176 based on the potential at the connection point between the resistors 174 and 176. The potential at the connection point between the resistors 174 and 176 serves as a potential at the anode side of the diode 42; the anode side of the diode 42 is opposite to the cathode side thereof connected to the input terminal, i.e. the collector, of the switching element S*#. If a rectifier is used as the diode 42, one conductive terminal in a pair of conductive terminals of the rectifier is connected to the input terminal, i.e. the collector, of the switching element S*#, and the other conductive terminal of the rectifier is connected to the pair of resistors 174 and 176.

Specifically, if the failure determining routine determines that the potential at the connection point between the resistors 174 and 176 is 0 V corresponding to the potential at the emitter of the switching element S*# during the period from when the drive signal g*# is changed to the on-drive command to when the switching element S*# is switched to the on state, the failure determining routine determines that a short-circuit failure occurs in one of the pair of resistors 174 and 176; the one of the pair of resistors 174 and 176 is connected to the emitter of the switching element S*#.

In this embodiment, the diode 44 is used as a rectifier that prevents a collector current flowing between the collector and emitter of the switching element S*# from flowing toward the drive IC 20. However, another semiconductor element adapted to enable a forward current to flow therethrough and disable a reverse current from flowing therethrough can be used as the rectifier.

In this embodiment, an IGBT is used as a switching element SY# of each drive unit DU, but a MOSFET can be used as a switching element SY# of each drive unit DU.

Each drive unit DU according to this embodiment is applied to a power converter, such as a converter CV or an inverter IV, installed in motor vehicles, but the present disclosure is not limited to the application. Specifically, each drive unit DU according to this embodiment can be applied to a power converter in another machine, and can be applied to another device.

While an illustrative embodiment of the present disclosure has been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A driver for a switching element, the driver comprising:
a dissipating unit for dissipating electrical charge stored therein to an input terminal of a switching element when a potential difference between the input terminal and an output terminal of the switching element is lower than a predetermined potential, the electrical charge being for detection of an overcurrent flowing between the input and output terminals,
the dissipating unit comprising a rectifier connected to the input terminal of the switching element,
the rectifier being configured to prevent a current from flowing from the input terminal to one of both ends of the rectifier, the one of both ends of the rectifier being opposite to the input terminal;
an overcurrent determining means for determining that the overcurrent flows when the electrical charge has not been dissipated to the input-terminal side via the rectifier although the switching element is turned from an off state to an on state; and
a failure determining means for determining whether there is a failure in the dissipating unit as a function of a potential at the one of both ends of the rectifier, the one of both ends of the rectifier being opposite to the input terminal;
wherein the dissipating unit comprises a capacitor connecting between the one of both ends of the rectifier being opposite to the input terminal and the output terminal of the switching element,
the driver further comprising:
a power supply source configured to apply a voltage to a connection point between the rectifier and the capacitor,
the failure determining means being configured to determine that there is an insulation failure between paired electrodes of the capacitor when the potential at the connection point is lower than a predetermined threshold level during a period that the switching element is switched to the on state.

2. The driver according to claim 1, wherein the predetermined threshold level is determined based on:
a potential difference between the input and output terminal of the switching element if no overcurrent flows through the input and output terminals while the switching element being the on state; and
a voltage drop across the rectifier if the electrical charge has been dissipated via the rectifier toward the input terminal side.

3. A driver for a switching element, the driver comprising:
a dissipating unit for dissipating electrical charge stored therein to an input terminal of a switching element when a potential difference between the input terminal and an output terminal of the switching element is lower than a predetermined potential the electrical charge being for detection of an overcurrent flowing between the input and output terminals,
the dissipating unit comprising a rectifier connected to the input terminal of the switching element, the rectifier being configured to prevent a current from flowing from the input terminal to one of both ends of the rectifier, the one of both ends of the rectifier being opposite to the input terminal;
an overcurrent determining means for determining that the overcurrent flows when the electrical charge has not been dissipated to the input-terminal side via the rectifier although the switching element is turned from an off state to an on state; and
a failure determining means for determining whether there is a failure in the dissipating unit as a function of a potential at the one of both ends of the rectifier, the one of both ends of the rectifier being opposite to the input terminal;
wherein the dissipating unit further comprises a capacitor connecting between the one of both ends of the rectifier being opposite to the input terminal and the output terminal of the switching element, the driver further comprising:
an open-close element provided in an electrical path connecting between the output terminal and a connection point between the rectifier and the capacitor, the open-close element turned to open or close the electrical path;
a power supply source configured to apply a voltage to the connection point between the rectifier and the capacitor; and
a turning means for turning on the open-close element during a period that the switching element is turned to the off state,
the failure determiner being configured to determine that there is a leak failure in the rectifier when the potential at the connection point is higher than a predetermined threshold level during the period that the switching element is switched to the off state,
the predetermined threshold level being previously determined based on a product of a level of a current flowing from the power supply source to the open-close element and an on resistance of the open-close element.

4. The driver according to claim 3, further comprising:
a resistor provided in the electrical path.

5. The driver according to claim 1, wherein the power supply source is a constant current source.

6. The driver according to claim 1, further comprising:
a notifying means for externally notifying, when it is determined that there is a failure by the failure determining means, information indicative of an occurrence of the failure.

7. The driver according to claim 2, wherein the power supply source is a constant current source.

8. The driver according to claim 3, wherein the power supply source is a constant current source.

9. The driver according to claim 4, wherein the power supply source is a constant current source.

* * * * *